United States Patent [19]

Obayashi et al.

[11] Patent Number: 4,749,625
[45] Date of Patent: Jun. 7, 1988

[54] AMORPHOUS METAL LAMINATE SHEET

[75] Inventors: Tsutomu Obayashi, Tokyo; Saburo Baba, Nagareyama; Manabu Imoto, Soka; Shinobu Watanabe, Ora, all of Japan

[73] Assignee: Hiraoka & Co., Ltd., Tokyo, Japan

[21] Appl. No.: 26,461

[22] Filed: Mar. 16, 1987

[30] Foreign Application Priority Data

| Mar. 31, 1986 | [JP] | Japan | 61-71249 |
| May 15, 1986 | [JP] | Japan | 61-109480 |
| May 23, 1986 | [JP] | Japan | 61-117484 |
| Jun. 25, 1986 | [JP] | Japan | 61-147030 |
| Jul. 30, 1986 | [JP] | Japan | 61-177823 |
| Sep. 26, 1986 | [JP] | Japan | 61-226272 |
| Oct. 24, 1986 | [JP] | Japan | 61-252017 |

[51] Int. Cl.$^4$ ............................................. B32B 15/08
[52] U.S. Cl. ................................... 428/624; 428/625; 428/626; 428/461; 428/463; 428/464; 428/256; 148/403
[58] Field of Search ............... 428/624, 625, 626, 461, 428/463, 464, 256; 148/403

[56] References Cited

U.S. PATENT DOCUMENTS

| 4,469,536 | 9/1984 | Forester | 148/403 |
| 4,603,092 | 7/1986 | Luch | 428/626 |
| 4,678,699 | 7/1987 | Kritchevsky et al. | 428/256 |
| 4,699,830 | 10/1987 | White | 428/35 |

FOREIGN PATENT DOCUMENTS

| 61-165272 | 7/1986 | Japan . |
| 61-166986 | 7/1986 | Japan . |
| 61-195992 | 8/1986 | Japan . |
| 61-195993 | 8/1986 | Japan . |
| 61-219465 | 9/1986 | Japan . |
| 61-222675 | 10/1986 | Japan . |

Primary Examiner—L. Dewayne Rutledge
Assistant Examiner—George Wyszomierski

[57] ABSTRACT

An amorphous metal laminate sheet having an excellent electromagnetic wave-shielding effect including a core layer containing at least one amorphous metal sheet layer which may be plated with an electroconductive metal, at least one flexible polymeric coating layer laminated on at least one surface of the amorphous metal-coating core layer, and optionally, at least one reinforcing fibrous fabric layer.

36 Claims, 3 Drawing Sheets

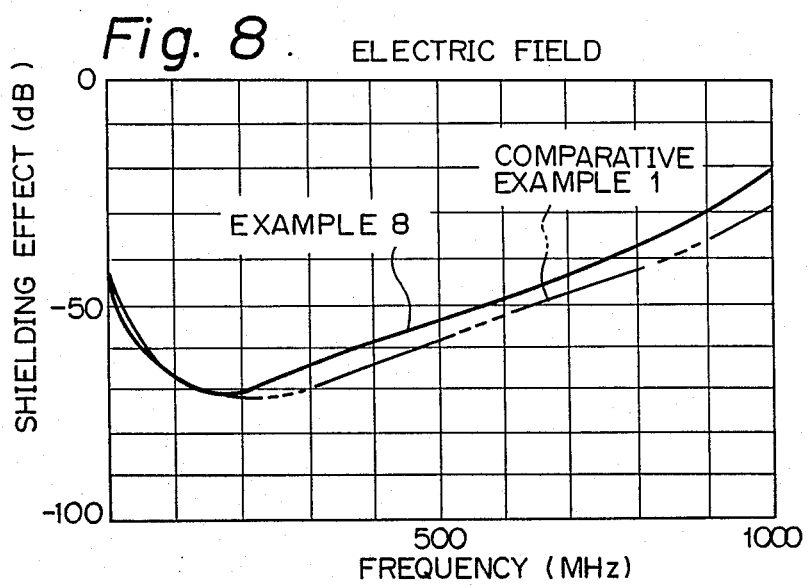
Fig. 8. ELECTRIC FIELD
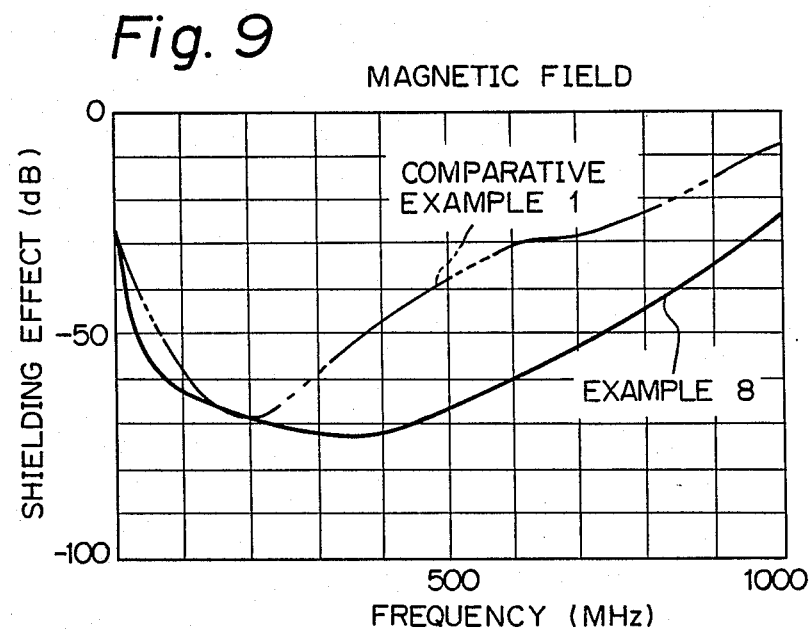
Fig. 9 MAGNETIC FIELD

AMORPHOUS METAL LAMINATE SHEET

BACKGROUND OF THE INVENTION (1) Field of the Invention

The present invention relates to an amorphous metal laminate sheet. More particularly, the present invention relates to an amorphous metal laminate sheet having an excellent electromagnetic wave-shielding property and, optionally, a water-proof property and stain-proof property.

(2) Description of the Related Art

It is well known that a water-proof laminate sheet comprising a substrate consisting of a fibrous fabric and at least one flexible, water-proof polymeric coating layer formed on at least one surface of the substrate is useful for tents, membrane structures, and covering sheets.

With the recent development and popularization of electronic devices and appliances, a material effective for shielding and protecting the electronic devices and appliances from the undesirable influences of static electricity and electromagnetic waves has become necessary.

In a known manner for shielding the electronic devices and appliances from the static electricity, various electroconductive sheets containing an electroconductive material, for example, carbon powder, carbon fibers, metallic foil or metal powder, are utilized. However, the conventional electroconductive sheets do not always exhibit a satisfactory electromagnetic wave-shielding property for protecting the electronic devices and appliances.

SUMMARY OF THE INVENTION

An object of the present invention is to provide an amorphous metal laminate sheet having an excellent shielding property against static electricity and electromagnetic waves.

Another object of the present invention is to provide an amorphous metal laminate sheet useful as a static electricity and electromagnetic wave-shielding sheet, for example, cover sheet, carpet or wallpaper sheet, having a satisfactory mechanical strength and, optionally, a water-proof property.

The above-mentioned objects can be attained by the amorphous metal laminate sheet of the present invention which comprises a core layer comprising at least one amorphous metal layer and at least one flexible polymeric coating layer laminated on at least one surface of the amorphous metal-containing core layer.

Optionally, the amorphous metal-containing laminate sheet of the present invention further comprises at least one reinforcing layer which may comprise at least one fibrous fabric attached to the amorphous metal-containing core layer and/or the flexible polymeric coating layer.

DESCRIPTION OF THE PREFERRED EMBODIMENTS

Recently, attempts have been made to utilize the unique properties of the amorphous metals for various purposes.

In the laminate sheet of the present invention, one or two surfaces of an amorphous metal-containing core layer are coated with one or two flexible polymeric coating layers.

Figure 1:
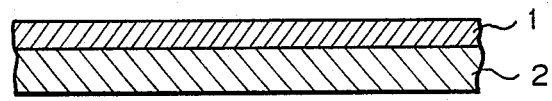
FIGS. 1 to 7 are respectively cross-sectional views of an embodiment of the amorphous metal laminate sheet of the present invention; and, FIGS. 8 and 9 are graphs showing relationships between a frequency of electromagnetic waves and an electromagnetic wave-shielding effect of a laminate sheet of the present invention in an electric field and in a magnetic field.
Figure 2:
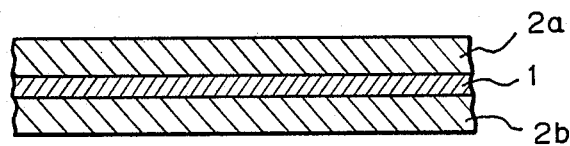

That is, as shown in FIG. 1, one surface of an amorphous metal-containing core layer 1 is coated by a flexible polymeric coating layer 2, and as shown in FIG. 2, two surfaces of an amorphous metal-containing core layer 1 are coated by two flexible polymeric coating layers 2a and 2b.

Generally, the amorphous metal is supplied in the form of ribbons having a width of 2.54 cm (1 inch) to 10.16 cm (4 inches), and is expected to be supplied in the form of a wide ribbon having a width of 20.32 cm (8 inches) in the near future. But, it has been believed that the conventional amorphous metal ribbons cannot be utilized for providing an industrial cover sheet or large width sheet.

However, these amorphous metal ribbons can be used in the amorphous metal laminate sheet of the present invention.

The amorphous-metal-containing core layer usable for the present invention may consist of at least one amorphous metal layer alone or at least one amorphous metal layer and at least one electroconductive metal plating layer formed on at least one surface or-the amorphous metal layer.

The electroconductive metal plating layer preferably comprises at least one member selected from copper, nickel, cobalt, iron, aluminum, gold, silver, tin, zinc, and alloys containing at least one member selected from the above-mentioned metals.

The amorphous metal usable for the present invention is not restricted to a specific type of metal, as long as the amorphous metal exhibits a satisfactory effect for shielding electronic devices and appliances from static electricity and electromagnetic waves, and can be selected from commercially available amorphous metals. The amorphous metal usable for the present invention preferably comprises a principal component consisting of at least one member selected from Fe, Co, Ni, Pd, Cu, Nb, and Ti and an additional component comprising at least one member selected from B, Si, C, Co, Ni, Cr, Zr, Nb, Cu, Ti and Mo, but not containing the metals contained in the principal component.

Suitable examples of the amorphous metals usable for the present inventions are, an amorphous alloy consisting of 81% iron, 13.5% boron, 3.5% silicon, and 2% carbon (Trademark: METGLAS No. 2605 SC, Allied Corp.); an amorphous alloy consisting of 78% iron, 13% boron, and 9% silicon (Trademark: METGLAS No. 2605 S-2, Allied Corp.); an amorphous alloy consisting of 87 parts iron, 14 parts boron, 1 part silicon, and 18 parts cobalt (Trademark: METGLAS No. 2605-CD, Allied Corp.); and an amorphous alloy consisting of 40% iron, 2.8% nickel, 4% molybdenum, and 18% boron (Trademark: METGLAS No. 2826-MB, Allied Corp.).

Also, the amorphous metals usable for the present invention include cobalt-based amorphous alloys, for example, consisting of 78% cobalt, 10% silicon, and 12% boron (78Co - 10Si - 12B); 56% cobalt, 26% chromium, and 18% carbon (56Co - 26Cr -18C); 90% cobalt and 10% zirconium (90Co - 10Zr); 44% cobalt, 36% molybdenum, and 20% carbon (44Co - 36Mo - 20C); and 34% Co, 28% Cr, 20% Mo, and 18% C (34Co - 28Cr - 20Mo - 18C); nickel-based amorphous alloys, for example, consisting of 90% nickel and 10% zirconium (90Ni - 10Zr); 78% nickel, 10% silicon and 12% boron (78Ni - 10Si - 12B); and 34% nickel 24% chromium, 24% molybdenum and 18% carbon (34Ni - 24Cr - 24Mo - 18C); lead-based amorphous metals, for example, consisting of 80% lead and 20% silicon (80Pb - 20Si); copper-based amorphous metals, for example, consisting of 80% copper and 20% zirconium (80Cu -20Zr); nyobium-based amorphous metals, for example, consisting of 59% niobium and 50% nickel (50Nb - 50Ni); and titanium-based amorphous metals, for example, consisting of 50% titanium and 50% copper (50Ti - 50Cu).

As stated above, the amorphous metals are usually supplied in the form of ribbons having a narrow width of 2.54 cm to 10.16 cm. Accordingly, in the laminate sheet of the present invention, the amorphous metal containing core layer comprises a plurality of amorphous metal ribbons arranged in parallel to each other, to provide an amorphous metal sheet having a desired width of, for example, from 5 to 20 cm.

The arranged metal ribbons may not be bonded to each other or may be bonded at the longitudinal edge portions thereof by soldering or bonding with an adhesive material. The adhesive material is preferably electroconductive.

The soldering of the amorphous metal ribbons can be effected by any known soldering methods and soldering materials, as disclosed, for example, in Japanese Unexamined Patent Publication Nos. 61-165,272, 61-219,465, and 61-222,675.

The amorphous metal sheet can be produced from an amorphous metal powder or can be a woven, knitted or nonwoven fabric-like sheet made from amorphous metal wires.

The amorphous metal is an excellent magnetic material and, therefore, the amorphous metal-containing core layer exhibits an excellent shielding effect against a magnetic field.

When at least one surface of the amorphous metal sheet is plated with an electroconductive metal, the resultant plating layer exhibits an excellent shielding effect against an electric field. Therefore, the electroconductive metal-plated amorphous metal sheet exhibits an excellent shielding effect to an electric field in addition to an excellent shielding effect to a magnetic field. That is, the electroconductive metal-plated amorphous metal sheet exhibits an excellent shielding effect to electromagnetic waves over a wide range of from a low frequency to a high frequency.

Also, the plated electroconductive metal layer is effective for enhancing the solder-bonding property of the amorphous metal sheet. The plating of the amorphous metal sheet can be effected by any known plating methods and with any known electroconductive metallic materials, as disclosed, for example, in Japanese Unexamined Patent Publication Nos. 61-195,992, 61-195,993, and 61-166,986.

The amorphous metal-containing core layer in the laminate sheet of the present invention can have any desired thickness, which can be varied in accordance with the type and use of the laminate sheet.

When the laminate sheet is used as an electromagnetic wave-shielding covering sheet, the thickness of the laminate sheet is preferably 1000 μm or less, more preferably in the range of from 1 to 500 μm, still more preferably in the range of from 5 to 100 μm, most preferably in the range of from 10 to 50 μm.

If the thickness is more than 1000 μm, the resultant amorphous metal-containing core layer sometimes exhibits an excessively large rigidity and stiffness, and thus the resultant laminate sheet exhibits a poor draping property and a high resistance to deformation, and when cut or broken, the cut section forms a dangerously sharp edge.

Also, the thickness of the electroconductive metal plating layer is preferably 0.1 μm or more, more preferably in the range of from 0.1 to 5 μm.

The laminate sheet of the present invention containing the amorphous metal-containing core layer preferably exhibits an electromagnetic wave-shielding effect of 10 dB or more, more preferably 30 dB or more, still more preferably 60 dB or more, most preferably 90 dB or more.

The surfaces of the amorphous metal layer may be coated with a thin protecting layer consisting of, for example, a rust-preventing agent.

In the laminate sheet of the present invention, at least one surface of the amorphous metal-containing core layer is coated with at least one flexible polymeric coating layer. The flexible polymeric coating layer may be a fibrous fabric layer, a paper sheet layer or a water-proof polymeric film layer.

The flexible, water-proof polymeric coating layer preferably comprises at least one member selected from natural rubber, synthetic rubbers, for example, neoprene rubbers, chloroprene rubbers, silicone rubbers, and chlorosulfonated polyethylene rubbers, and synthetic polymer resins, for example, polyvinyl chloride resins, ethylene-vinyl acetate copolymer resins, polyacrylic resins, silicone resins, polyurethane resins, polyethyrene resins, polypropylene resins, polyester resins, and fluorine-containing polymer resins.

The flexible, water-proof polymeric coating layer has a thickness appropriate and sufficient for imparting desired levels of water-proof, flexibility, and fireproof property, and mechanical strength, to the resultant laminate sheet. This thickness is, for example, 0.05 mm or more, preferably, from 0.05 to 1.0 mm.

The flexible, water-proof polymeric coating layer can be formed by coating a surface of the amorphous metal-containing core layer with a film, solution, emulsion, paste or straight resin or a water-proof polymeric material by a topping, calendering, coating, or dipping method.

The flexible polymeric coating layer may contain usual additives, for example, a plasticizer, stabilizer, coloring matter, ultraviolet ray-absorbing agent, fireproof agent, or flame retardant.

As stated above, it is known that a surface of a usual metallic foil is coated with a rust-resisting polymer in a very small thickness of from 1 to 10 μm. However, in the laminate sheet of the present invention, usually the flexible, water-proof polymeric coating layer has a thickness of 50 μm or more, preferably, from 50 to 5000 μm, more preferably, 100 to 3000 μm, still more preferably 200 to 2000 μm. That is, the flexible, water-proof polymeric coating layer should be definitely distinguished from the thin rust-resisting polymeric coating layer.

The flexible, water-proof polymeric coating layer may have a single layer structure or a two or more layers structure. For example, the flexible, water-proof polymeric coating layer usable for the present invention may consist of a base layer comprising a flexible, water-proof polymer, which base layer is usually laminated on the amorphous metal-containing core layer, and a surface layer which comprises a stain-proof, weather-resistant polymer, which surface layer is formed on the flexible, water-proof polymeric base polymer and which provides an outermost surface layer of the resultant laminate sheet.

Figure 3:
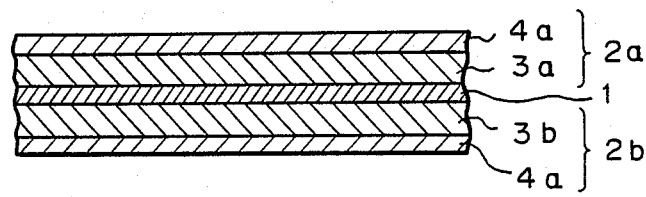

As shown in FIG. 3, an upper surface of amorphous metal-containing core layer 1 is coated with a flexible polymeric coating layer 2a composed of a flexible, water-proof polymeric base layer 3a laminated on the amorphous metal containing core layer 1 and a stain-proof, weather-resistant surface layer 4a attached to the base layer 3a. Also, the lower surface of the core layer 1 is coated with a flexible polymeric coating layer 2b composed of a flexible, water-proof polymeric base layer 3b and a stain-proof, weather-resistant polymeric surface layer 4b, laminated as shown in FIG. 3.

The stain-proof, weather-resistant polymer is preferably selected from fluorine-containing polymers and polyacrylic polymers.

Generally, the fluorine-containing polymer exhibits an excellent flame retarding property, stain-proof property and weather-resistance. However, the fluorine-containing polymers have a poor affinity to ordinary plastic adhesive agents, and therefore, it is very difficult to bond the fluorine-containing polymeric surface layer to the flexible, water-proof polymeric base layer with the ordinary adhesive agents unless the bonding surface portion of the fluorine-containing polymeric surface layer is modified.

When the bonding surface of the fluorine-containing polymeric film is modified by applying thereto a corona discharge treatment or a low temperature plasma treatment, the modified surface exhibits an increased bonding activity and an enhanced affinity to the adhesive agent, for example, polyvinyl chloride resins, epoxy resins, polyacrylic resins or polyester resins. Therefore, the modified fluorine-containing polymeric film can be firmly bonded to the base layer with the adhesive agent.

The corona discharge treatment is carried out, for example, under a voltage of 100 to 200 V, at a static capacity of 40 to 100 $\mu$F, and at a short circuit current of 1 to 2 A.

The modification of the fluorine-containing polymer film can be effected by treatments other than the above-mentioned types of treatments, which are effective for enhancing the bonding property thereof.

The fluorine-containing polymers may be selected from fluoroethylene polymers, for example, polytetrafluoroethylene; polyfluorochloroethylene polymers, for example, polytrifluorochloroethylene and polydichlorodifluoroethylene; and other fluorine-containing polymers, for example, polyvinyl fluoride and polyvinylidene fluoride.

The above-mentioned fluorine-containing polymers have a high melting point and a low processability, for example, a poor calendering property. Therefore, the fluorine-containing polymer materials are usually shaped into a film by melting the polymer, and then extruding a melt through a film-forming T-die or by heat-pressing a polymer powder in a mold. However, the shaping process for the fluorine-containing polymer is not limited to those described above.

The film of the fluorine-containing polymer usable for the present invention usually has a thickness in the range of from 0.001 mm to 0.5 mm, preferably, from 5 to 50 $\mu$m. The thickness of the film is, however, not limited to the above-mentioned value as long as the film effectively attains a high weather-resistance, stain-resistance, and durability of the resultant composite sheet.

The fluorine-containing polymer film may contain an additional polymeric component, for example, polymethylmethacrylate, blended therewith. Also, the fluorinecontaining polymer film may be laminated with another film, for example, polymethyl methacrylate film, as long as the purpose of the present invention can be accomplished.

The fluorine-containing polymer films are available on the market under the trademarks of Tedlar film (Du Pont), Aflex film (Asahi Glass), and KFC film (Kureha Chemical).

The fluorine-containing polymer surface layer is preferably formed by laminating a fluorine-containing polymer film having a smooth upper surface onto the flexible, water-proof polymeric base layer. The fluorine-containing polymer film preferably has a tensile strength of 100 kg/cm$^2$ or more.

The fluorine-containing polymer surface layer can be provided by applying a solution or emulsion of a fluorine-containing polymer onto an upper surface of the flexible, water-proof polymer base layer.

The stain-proof, weather-resistant polymer surface layer may consist of a polyacrylic resin and may be formed by laminating a polyacrylic polymer film onto the flexible, water-proof polymer base layer with an adhesive agent, or by applying a solution or emulsion of a polyacrylic polymer onto the base layer and allowing the resultant solution or emulsion layer to solidify.

The polyacrylic polymer film usable for the present invention preferably has a tensile strength of 100 kg/cm$^2$ or more, a weight of 1 to 50 g/m$^2$, more preferably 3 to 30 g/m$^2$, and a thickness of 3 $\mu$m or more, more preferably 3 to 50 $\mu$m, still more preferably 4 to 30 $\mu$m, but is not limited to the above-mentioned strength, weight and thickness values.

The polyacrylic polymer film can be produced by means of a T-die inflation or other conventional film-forming method. The polyacrylic polymer film is either an undrawn or drawn film. The polyacrylic polymer film usable for the present invention preferably has an ultimate elongation of 100% to 300%. The polyacrylic polymers usable for the present invention are selected from polyalkylmethacrylate polymers, for example, homopolymers of methylmethacrylate, ethylmethacrylate, propylmethacrylate, and butylmethacrylate, and copolymers of two or more of the above-mentioned methacrylate monomers and of one or more of the methacrylate monomers with at least one monomer selected from alkyl acrylates, vinyl acetate, vinyl chloride, styrene, acrylonitrile, and methacrylonitrile.

The stain-proof, weather-resistant polymer surface layer usable for the present invention may be a laminated composite layer consisting of a polyvinyl fluoride layer and a polyacrylic polymer layer laminated one on the other, or of a polyvinyl fluoride layer, a polyacrylic polymer layer, and a polyvinyl chloride layer superimposed on and bonded to each other. In the above-mentioned laminated composite layer, the polyvinylidene fluoride layer preferably has a thickness of 2 to 3 $\mu$m, the polyacrylic polymer preferably has a thickness of 2 to 4 μm, and the polyvinyl chloride layer preferably has a thickness of 40 to 45 μm.

Generally, the flexible polymeric coating layer to be formed on the amorphous metal-containing core layer may have a number of perforations for removing air bubbles or other gas bubbles formed in the coating layer or between the core layer and the coating layer. The perforations preferably have a diameter of 0.1 to 1 mm, and a density of 10 to 100 per 100 cm$^2$ of the laminate sheet surface.

When the coating layer is formed by laminating a flexible polymeric film onto the core layer surface, preferably the flexible polymeric film is provided with the bubble-removing perforations. When the coating layer is provided by coating a flexible polymeric film surface with a polymeric solution or emulsion, the bubble-removing perforations can be formed in the coating layer by pricking the bubbles.

The amorphous metal sheet layer usable for the present invention can be produced by arranging a number of amorphous metal ribbons in parallel to each other.

The parallel arranged amorphous metal sheet may not be bonded to each other or may be bonded to each other at the longitudinal edge portions thereof by a solder or a bonding resin.

The bonded or not bonded longitudinal edge portions of the amorphous metal ribbons may be overlapped or the side faces of the edge portions may be brought into contact with each other without overlapping.

In one example, the amorphous metal ribbons extend along the longitudinal direction of the laminate sheet. In this example, the overlapping portions or contacting side portions extend in parallel to the longitudinal axis of the laminate sheet. This results in an unevenness in thickness and/or mechanical strength of the amorphous metal sheet layer when observed in the transverse directions of the sheet.

In another example, the above-mentioned disadvantages of the resultant amorphous metal sheet layer can be removed by arranging a plurality of amorphous metal ribbons in parallel to each other in the transverse direction of the sheet. The arranged ribbons can be bonded to each other by any bonding material as described before, or may not be bonded to each other. This type of amorphous metal sheet can be easily processed, and the resultant laminate sheet have an even form and properties.

In the laminate sheet of the present invention, the amorphous metal-containing core layer contains at least one amorphous metal layer which is very thin, and thus has a relatively poor tensile strength and a very low tear strength. For example, an amorphous metal membrane having a thickness of 25 μm exhibits a wide tensile strength varying in the range of from 65 to 125 kg/3 cm and an average tensile strength of 100 kg/3 cm.

Also, the amorphous metal layer is composed of a plurality of amorphous metal ribbons which are bonded or not bonded to each other. Therefore, the amorphous metal layer exhibits a significant directional property and unevenness in mechanical strength thereof and.

The above-mentioned disadvantages can be removed by inserting at least one reinforcing fibrous fabric layer having a higher tensile strength than that of the core layer into the laminate sheet of the present invention.

Preferably, in the laminate sheet of the present invention, one or two surfaces of the amorphous metal-containing core layer are attached with one or two reinforcing fibrous fabric layers to provide a substrate layer, and one or two surface of the substrate layer are coated with one or two flexible polymeric coating layers.

Figure 4:
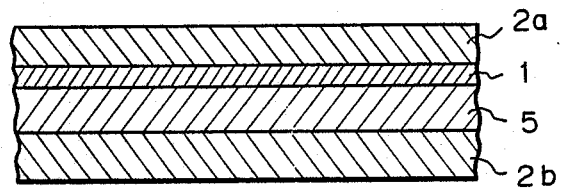

Referring to FIG. 4, an upper surface of an amorphous metal-containing core layer 1 is coated with a flexible polymeric coating layer 2a, a reinforcing fibrous fabric layer 5 is attached to a lower surface of the core layer 1, and another flexible polymeric coating layer 2b is attached to the reinforcing fibrous fabric layer 5.

The fibrous fabric usable for the reinforcing layer of the present invention can be selected from those made from at least one type of fiber or filament selected from natural fibers, for example, cotton, hemp, and flax; inorganic fibers, for example, ceramic fibers, silica fibers, carbon fibers, glass fibers, asbestos, and metallic fibers; regenerated fibers, for example, viscore rayon and cupra fibers; semisynthetic fibers, for example, cellulose di- and tri-acetate fibers; and synthetic fibers, for example, nylon 6 fibers, nylon 66 fibers, polyester (polyethylene terephtalate fibers), aromatic polyamide fibers, polyacrylonitrile fibers, polyvinyl chloride fibers, polyolefin fibers, and water-insolubilized polyvinyl alcohol fibers.

The fibers fabric may be a woven, knitted or non-woven fabric made from staple fiber-spun yarns, multi-filament yarns, monofilament yarns, split yarns, and/or tape yarns.

Preferably, the fibrous fabric is a woven fabric made from polyester multifilament yarns and/or glass fiber yarns. The woven fabric is not limited to any specific weave structure, but preferably, the woven fabric has a plain weave, or is a special fabric in which a number of warp yarns are placed on a number of weft yarns in such a manner that the warp yarns extend at a right angle to the weft yarns and the warp yarns and the weft yarns are combined at the intersections thereof with combining yarns. This special fabric is very useful as a reinforcing fibrous fabric for enhancing the mechanical strength of the resultant laminate sheet to a high level.

When the resultant laminate sheet is required to exhibit a high flexibility, the reinforcing fibrous fabric has a low density structure. However, when a high mechanical strength is necessary, preferably the reinforcing fibrous fabric has a high density structure.

Since the amorphous metal-containing core layer has a relatively low elongation, sometimes it is preferable that the reinforcing fibrous fabric layer be made of a low elongation fabric, for example, a glass fiber fabric.

Also, since the amorphous metal-containing core layer has a relatively high rigidity and stiffness, sometimes it is preferable that the reinforcing fibrous fabric layer be composed of the light, soft, woven or knitted fabric having a relatively low density structure.

The amorphous metal-containing core layer can be bonded with the reinforcing fibrous fabric layer by any known bonding method. Usually, the core layer is bonded with the reinforcing layer with an adhesive agent or an adhesive polymeric material. Otherwise, a surface portion of the reinforcing fibrous fabric is fused and the reinforcing fibrous fabric is bonded to the core layer through the fused surface portion thereof.

The adhesive agent for bonding the reinforcing layer to the core layer is not limited to a specific group thereof. That is, the adhesive agent can be selected from ordinary adhesive materials, for example, isocyanate compound bonding agents, epoxy compound bonding agents, polyacrylic resin bonding agents, polyurethane resin bonding agents, polyamide resin bonding agents, and rubber (especially synthetic rubber bonding agents). The adhesive agent also can be selected from, for example, acrylic compound bonding agents containing at least one radical selected from amino and imino radicals, ethyleneimine and alkylenediamine residues, aziridinyl radical-containing acrylate adhesive agents, aminoester-modified vinyl polymer/aromatic epoxy adhesive agents, or amino-containing methacrylate adhesive agents.

The reinforcing fibrous fabric layer, the flexible polymeric coating layer, and/or adhesive agent layer may be electroconductive or semi-electroconductive, or may have an electrical insulating property.

When an reinforcing fibrous fabric layer having a small ultimate elongation of 5% or less is used, the elongation property and strain-stress curve of the reinforcing fibrous fabric layer becomes close to those of the amorphous metal-containing core layer and, therefore, the resultant substrate layer exhibits an enhanced tensile strength.

Also, when the reinforcing fibrous fabric layer having a small ultimate elongation of 5% or less, or equal to that of the amorphous metal ribbons, is bonded to the amorphous metal-containing core layer, the amorphous metal layer can be formed merely by arranging a plurality of amorphous metal ribbons in parallel to each other without soldering or bonding them to each other. The resultant laminate sheet containing the arranged amorphous metal ribbons which are not soldered or bonded to each other, exhibits a good appearance.

The low elongation fibrous fabric layer can be formed from low elongation fibers or filaments which are not limited to a specific group of fibers or filaments.

Examples of the low elongation fibers are as follows.

| Fiber | Tensile strength (kg/mm$^2$) | Ultimate elongation (%) |
| --- | --- | --- |
| Glass fiber | 350~600 | 3~4 |
| Carbon fiber | 200~300 | 0.5~1.5 |
| Steel fiber | 240 | 1.7 |
| Aromatic polyamide fiber | 285 | 2.0~5.0 |

The above-mentioned low elongation fibers also exhibit an undesirable low flexural strength. Therefore, preferably the low elongation fibrous fabric is composed of a blend of the low elongation, low flexural strength fibers with relatively high elongation, high flexural strength fibers.

Examples of the relatively high elongation, high flexural strength fibers are as follows.

| Fiber | Tensile strength (kg/mm$^2$) | Ultimate elongation (%) |
| --- | --- | --- |
| Polyester fiber | About 115 | About 13 |
| Polyamide (nylon 66) fiber | About 100 | About 19 |

The low elongation reinforcing fibrous fabric layer is effective for enhancing the mechanical strength of the resultant laminate sheet in the longitudinal direction of the amorphous metal ribbons contained therein, for imparting a satisfactory mechanical strength to the laminate sheet in the transverse direction of the amorphous metal ribbons, and for making the mechanical strength of the laminate sheet even.

Preferably, the reinforcing fibrous fabric layer usable for the present invention is composed of at least one fibrous sheet containing fibers or filaments having a tensile strength of 130 kg/mm$^2$ and an ultimate elongation of 5% or less. Also, it is more preferable that the fibrous sheet be composed of a blend of high strength fibers or filaments having a tensile strength of 130 kg/mm$^2$ or more and an ultimate elongation of 5% or less with high elongation fibers or filaments having a tensile strength of less than 130 kg/mm$^2$ and an ultimate elongation of more than 5%.

When two reinforcing fibrous fabric layers are attached to two sides of the amorphous metal-containing core layer, preferably one fabric layer is composed of high strength fibers or filaments having a tensile strength of 130 kg/mm$^2$ or more and an ultimate elongation of 5% or less, and the other fabric layer is composed of high elongation fibers or filaments having a tensile strength of less than 130 kg/mm$^2$ and an ultimate elongation of more than 5%.

Alternatively, the reinforcing fabric layer preferably comprises at least one fibrous layer comprising high strength fibers or filaments having a tensile strength of 130 kg/mm$^2$ or more and an ultimate elongation of 5% or less and at least one fibrous layer comprising high elongation fibers or filaments having a tensile strength of less than 130 kg/mm$^3$ and an ulntiate elongation of more than 5%.

In an embodiment of the laminate sheet of the present invention, the flexible polymeric coating layer comprises at least one fibrous fabric covering layer composed of natural or artificial fibers or filaments. That is, the fibers or filaments are in the form of a woven fabric, knitted fabric, nonwoven fabric or composite fabric, preferably, a pile fabric composed of a fabric underlayer and a pile upperlayer consisting of a number of fiber yarns projecting from the fabric underlayer.

Figure 5:
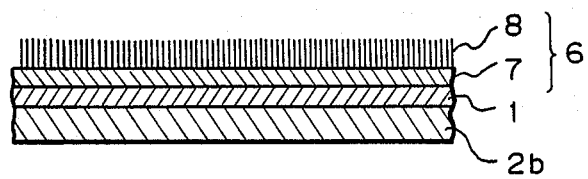

Referring to FIG. 5, the lower surface of an amorphous metal-containing core layer 1 is coated with a non-fibrous, flexible polymeric coating layer 2b. Also, the upper surface of the core layer 1 is covered by a fibrous pile fabric covering layer 6 consisting of a fabric underlayer 7 attached to the upper surface of the core layer 1 and a pile upperlayer 8 formed on the fabric underlayer 7.

The pile fabric can be produced from at least one type of organic fibers including natural fibers, for example, cotton, wool and hemp, semisynthetic fibers, for example, cellulose di- or tri-acetate, and synthetic fibers, for example, polyester fibers, polyethylene fibers, polypropylene fibers, nylon 6 fibers, nylon 66 fibers, and acrylonitrile fibers. The pile fabric may contain a small amount of inorganic fibers, for example, glass fibers, carbon fibers, and metallic fibers, blended with the organic fibers. The fibers may be in the form of a fiber mass, yarns including spun yarns, multifilament yarns, tape yarns, split yarns, round regular mono-filament yarns, and flat irregular monofilament yarns.

The pile fabric may be selected from cut pile fabrics, loop pile fabrics, needle-punched pile fabrics, and tufted pile fabrics.

The laminate sheet of the present invention having the pile fabric covering layer attached to the amorphous metal-containing core layer is useful as an electromagnetic wave-shielding carpet.

The pile upperlayer in the pile fabric covering layer may contain electroconductive fibers, for example, carbon fibers and metallic fibers.

In the above-mentioned laminate sheet of the present invention, the fabric underlayer in the pile fabric covering layer is bonded to an upper surface of the amorphous metal-containing core layer through a flexible polymeric bonding layer. Also, a lower surface of the amorphous metal-containing core layer is coated with another flexible polymeric coating layer which is preferably formed from at least one thermoplastic polymeric material, for example, polyvinyl chloride resin, polyurethane resin, ethylene-vinyl acetate copolymer resin, polypropylene resin, asphalt, bitumen, natural rubber, or synthetic rubber, for example, styrene-butadiene rubber, or chlorosulfonated polyethylene rubber. A most preferable thermoplastic material is a polyvinyl chloride resin which may contain a plasticizer, filler, coloring material, stabilizer and/or modifying agent. The flexible polymeric coating layer may contain, as an additive, a filler such bitumen and/or an electroconductive material such as carbon fibers or metallic powder.

In the electromagnetic wave-shielding laminate sheet carpet of the present invention, the amorphous metal layer preferably has a thickness of 70 μm or less, more preferably 10 to 70 μm, still more preferably 20 to 40 μm.

When the pile fabric covering layer is bonded to the amorphous metal-containing core layer through a flexible polymeric bonding layer, this bonding layer is effective not only for firmly bonding the amorphous metal-containing core layer to the pile fabric covering layer but also for protecting the amorphous metal-containing core layer from tearing, cutting and cracking when the laminate sheet is bent, wound or impacted. The bonding layer may have a water-proof property, flame-retarding property, fire-resisting property, and/or another functional property.

The bonding layer may comprise at least one flexible polymeric material, for example, natural rubber; synthetic rubbers, for example, neoprene rubber, chloroprene rubber, silicone rubber and chlorosulfonated polyethylene rubber; synthetic polymeric resins, for example, polyvinyl chloride resins, ethylene-vinyl acetate copolymer resins, polypropylene resins, polyester resins, fluorine-containing polymer resins, polyamide resins, and ionomer resins; and regenerated cellulose resins and cellulose acetate resins.

The bonding layer preferably has a thickness of 1 to 70 82 m, more preferably 3 to 30 μm.

The amporhous metal-containing core layer is formed from a plurality of amorphous metal ribbons bonded or not bonded to each other, and thus is not plain. The bonding layer is effective for making the amorphous metal-containing core layer plain and smooth.

The electromagnetic wave-shielding laminate sheet or carpet of the present invention may be in the form of tile carpets which are square, rectangular or diamond-shaped.

Also, the amorphous metal-containing core layer in the laminate sheet of the present invention may be perforated or not perforated.

Furthermore, in the laminate sheet of the present invention having the fibrous fabric covering layer, the amorphous metal sheet layer preferably has a thickness of 70 μm or less, more preferably 10 to 70 μm, still more preferably 20 to 40 μm.

In another embodiment of the amorphous metal laminate sheet of the present invention, at least one of the flexible polymeric coating layers is a porous coating layer and is flexible and compressive. This porous coating layer is effective for imparting a preferable soft touch, an increased compression modulus, and an enhanced cushioning property to impact and pressure to the resultant laminate sheet.

That is, when an external force, for example, a bending force, compression force, tearing force or elongating force, is applied to the laminate sheet, the porous coating layer absorbs at least a portion of the external force so as to decrease the elongation and compression of the amorphous metal-containing core layer and to prevent the tearing or breaking, or permanent deformation, of the amorphous metal-containing core layer.

The laminate sheet of the present invention having the porous, flexible and compressive polymeric coating layer is useful as a covering sheet, packaging sheet or a container sheet for electronic devices or appliances.

The porous coating layer is preferably made from at least one member selected from a natural rubber, a synthetic rubber, for example, SBR, NBR, acrylonitrile rubber, polychloroprene rubber, polyisobutylene rubber, fluorine-containing polymer rubber, and silicone rubbers, and flexible synthetic polymer resins, for example, polyethylene resins, polyurethane resins, polyvinyl chloride resins and polystyrene resins.

The porous coating layer material may be a hard foam as long as it is flexible and compressive, or a soft foam; perferably, a soft foam.

The porous coating layer preferably has a porosity of 50% to 99% (a foaming ration of 2 to 100), more preferably 80 to 98% (a foaming ratio of 5 to 10). Usually, the extend of foaming of the porous coating layer is controlled to a foaming ration of 20 to 60.

Also, the porous coating layer preferably has a compression resistance of 10 kg/cm$^2$ or less, more preferably, 0.5 kg/cm$^2$, still more preferably, 0.1 kg/cm$^2$, at a compression of 25%.

The thickness of the porous coating layer is not limited to a specific level, but preferably, the porous coating layer has a thickness of 0.5 to 1000 mm, more preferably 1 to 50 mm.

The porous coating layer can be provided by laminating a porous polymeric sheet on the amorphous metal-containing core layer or by foaming a polymer layer formed on the amorphous metal-containing core layer and containing a foaming agent therein at a temperature higher than the melting point of the polymer layer.

The lamination of the porous polymeric sheet on the core layer can be effected by using an adhesive agent or by melting a laminating surface portion of the porous polymeric sheet.

Alternatively, the porous coating layer can be formed by coating a surface of the core layer with a polymeric coating liquid containing foams, and then solidifying the coated porous polymeric liquid layer.

The porous flexible polymeric coating layer may be provided on both or either one of the surfaces of the amorphous metal-containing core layer. Also, as an example, one surface of the core layer can be coated by a porous flexible polymeric coating layer and the opposite surface of the core layer coated by a non-porous flexible polymeric coating layer.

Figure 6:
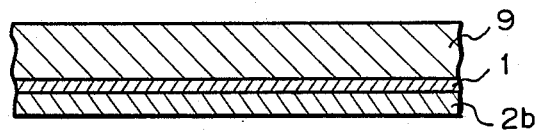

Referring to FIG. 6, an upper surface of an amorphous metal-containing core layer 1 is coated with a porous flexible polymeric coating layer 9 and a lower surface of the core layer 1 is coated with a non-porous flexible polymeric coating layer 2b.

In the embodiment of the laminate sheet of the present invention, the amorphous metal-sheet layer preferably has a thickness of 100 μm or less, more preferably, 1 to 70 μm, still more preferably 5 to 50 μm, most preferably 10 to 30 μm.

As another example, the porous flexible polymeric coating layer is reinforced by at least one reinforcing fibrous fabric layer as aforementioned.

Preferably, the reinforcing fibrous fibric layer is directly attached to at least one surface of the amorphous metal-containing core layer.

The laminate sheet of the present invention containing the reinforcing fibrous fabric layer is useful as a heavy packaging sheet or heavy covering sheet for electronic equipment to be protected from electromagnetic waves and static electricity.

In still another embodiment of the amorphous metal laminate sheet of the present invention, the flexible polymeric coating layer to be formed on the amorphous metal-containing core layer comprises at least one paper sheet or paper-like sheet attached to the amorphous metal-containing core layer.

This paper sheet or paper-like sheet layer-containing laminate sheet of the present invention id useful as an electromagnetic wave-shielding wallpaper sheet.

In this embodiment of the laminate sheet of the present invention, the amorphous metal sheet layer preferably has a thickness of 200 μm or less, more preferably, 100 μm or less, still more preferably 1 to 50 μm, most preferably 5 to 30 μm.

The paper sheet or paper-like sheet is preferably attached to the amorphous metal-containing core layer through a flexible polymeric bonding layer having a thickness of, preferably, 0.05 mm or more, more preferably 0.05 to 1.0 mm.

The flexible polymeric bonding layer is effective for firmly bonding the paper sheet or paper-like sheet to the amorphous metal-containing core layer, for making the bonding surface of the amorphous metal-containing core layer, and thus the surface of the resultant laminate sheet, plain and smooth, and for imparting an increased mechanical strength water-proof property, flame retarding property, and satisfactory appearance to the resultant laminate sheet.

The flexible polymeric bonding layer preferably comprises at least one member selected from natural rubber, synthetic rubbers, for example, neoprene rubber, chloroprene rubber, silicone rubbers and chlorosulfonated polyethylene rubbers synthetic polymeric resins, for example, polyvinyl chloride resins, ethylenevinyl acetate copolymer resins, polyacrylic resins, silicone resins, polyurethane resins, polyethylene resins, polypropylene resins, polyester resins, ionomer resins, polyamide resins, and fluorine-containing polymer resins, regenerated cellulose resins, and cellulose derivative resins, for example, cellulose diacetate and cellulose triacetate.

The flexible polymeric bonding layer can be formed on the amorphous metal-containing core layer by any known coating method, for example, topping, calendering, coating, or dipping.

The flexible polymeric bonding layer may contain an additive comprising a plasticizer, stabilizer, coloring material, ultraviolet ray-absorber, fire-resistant agent or flame-retardant.

The laminate sheet of the present invention may contain at least one reinforcing fibrous fabric layer attached to the amorphous metal-containing core layer. The reinforcing fibrous fabric layer is the same as that described above.

In the electromagnetic wave-shielding wallpaper sheet of the present invention, the paper sheet layer can have any color, pattern, and thickness. The term "paper sheet" used in this specification includes a paper sheet, a paper-like synthetic polymer sheet, paper-like fibrous fabric sheet or a combination of at least two of the above-mentioned sheets.

The paper sheet may have a desired color and/or pattern.

The paper sheet layer is adhered directly to the amorphous metal-containing core layer or through a flexible polymeric bonding layer thereto with an adhesive agent which is the same as described before.

Figure 7:
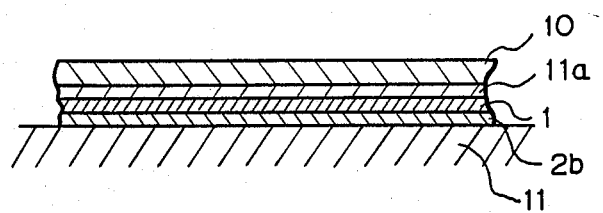

As shown in FIG. 7, a surface of an amorphous metal-containing core layer is coated with a flexible polymeric paper sheet layer 10 through a flexible polymeric bonding layer 11a. The opposite surface of the amorphous metal-containing core layer is adhered to a surface of a wall 11 through a flexible polymeric coating layer 2b free from the paper sheet layer.

In the provision of the electromagnetic wave-shielding wall, a complete amorphous metal laminate sheet of the present invention comprising the amorphous metal-containing core layer and the wallpaper sheet layer is adhered onto a wall surface. Alternatively, a laminate wall of the present invention is formed on a wall surface by adhering an amorphous metal-containing core sheet or a combination of an amorphous metal-containing core sheet with the flexible polymeric bonding layer, onto a wall surface, and then a paper sheet is further adhered onto the above-mentioned adhered layer. This method is effective for providing an evenly formed electromagnetic wave shielding wall.

Also, this method allows the wallpaper sheet and the amorphous metal-containing core sheet to be stored separately and, therefore, a number of combinations of various types of wallpaper sheets with various amorphous metal-containing core sheets become possible.

When two or more laminate sheets are applied onto a wall surface, preferably edge portions of the amorphous metal-containing core layers in the laminate sheets are connected to each other.

In the preparation of a coil of an amorphous metal sheet consisting of a plurality of amorphous metal ribbons arranged in parallel to each other and bonded or not bonded to each other at the longitudinal edge portions thereof, preferably the amorphous metal sheet is preliminarily coated with a flexible polymeric protecting layer under a condition wherein the amorphous metal sheet is not damaged or broken, and the resultant preliminarily coated amorphous metal sheet is wound into a coil.

The flexible polymeric protecting layer preferably consists of at least one member selected from the same natural rubber, synthetic rubbers, and synthetic polymer resins usable for the flexible polymeric bonding layer mentioned above.

The flexible polymeric protecting layer may contain an additive, for example, a water-proof agent, flame-resistance agent, or flame-retardant, and preferably has a thickness of 1 to 70 μm, more preferably, 3 to 30 μm.

Also, the flexible polymeric protecting layer can be formed by any known polymeric layer-forming method, for example, by applying a straight resin, paste, solution, latex, or emulsion of the polymeric material onto the amorphous metal containing core layer surface by any known method, for example, topping, coating, dipping, laminating, extrusion coating, spraying or calendering.

The flexible polymeric protecting layer may be directly adhered to or adhered through an adhesive agent layer to the amorphous metal-containing core layer. The adhesive agent can be selected from the same group as that described before.

The present invention will be further explained by way of specific examples, which, however, are representative and do not restrict the scope of the present invention in any way.

EXAMPLE 1

Both surfaces of an amorphous metal ribbon consisting of an amorphous alloy of 81% iron, 13.5% silicon, and 2% carbon (Trademark: METGLAS No. 2605 SC, made by Allied Chemical Co.), and having a width of 7.62 cm and a thickness of 25 μm, were plated with a copper-plating layer having a thickness of 1 μm.

An amorphous metal sheet having a width of about 1 mm was produced from 13 pieces of the copper plated amorphous metal ribbons, which were arranged in parallel to each other and extended in the longitudinal direction of the sheet, by then soldered together.

Two surfaces of the amorphous alloy sheet were coated with a synthetic rubber adhesive agent (Trademark: SC 12N, made by Sony Chemical).

A glass fiber victoria lawn (Trademark: KS-5210, made by Kanebo Glass Fiber Co.) having a thickness of 0.12 mm, a weight of 52 g/m², and the following weave structure:

10 warps+10 combining yarns/25.4 mm×10 wefts/25.4 mm, was bonded to one surface of the amorphous alloy sheet, and another polyester filament plain weave having the following structure, $$\frac{500 \text{ denier} \times 500 \text{ denier}}{7 \text{ warps}/25.4 \text{ mm} \times 7 \text{ warps}/25.4 \text{ mm}}$$

was bonded on the other surface of the amorphous alloy sheet.

The resultant core sheet was immersed in the following flexible water-proof resin composition:

| Components | Part (by weight) |
| --- | --- |
| Polyvinyl chloride resin | 80 |
| Butyl-benzyl phthalate | 68 |
| Opoxidized soybean oil | 7 |
| Calcium carbonate | 20 |
| Cd—Ba stabilizer | 3 |
| Pigment | 8 |
| Toluene (Solvent) | 130 |

The inversed core sheet was squeezed by a pair of nip rollers, and the amount of the composition in the core sheet was controlled to a level of 100% based on the weight of the core sheet. The core sheet was dried in an air drier at a temperature of 90° C. for one minute and then heat treated at a temperature of 180° C. for one minute to gelate the polyvinyl chloride resin.

The resultant flexible, water-proof resin-coating layer formed on the core sheet had a thickness of 0.3 mm.

One surface of the resultant sheet was coated at an elevated temperature with a three layer film (Trademark: KFC sheet, made by Kureha Chemical Industrial Co.) composed of a polyvinylidene fluoride layer having a thickness of 2 to 3 μm, a polyacrylic resin layer having a thickness of 2 to 4 μm, and a polyvinyl chloride resin layer having a thickness of 45 μm, in such a manner that the polyvinyl chloride resin layer in the KFC sheet came into contact with the composition-impregnated core sheet.

The opposite surface of the resultant sheet was coated with a polyacrylic resin film (made by Mitsubishi Rayon Co. Ltd.) having a thickness of 25 μm, at an elevated temperature.

The resultant laminate sheet exhibited an excellent electromagnetic wave-shielding effect of 50 dB and superior water-proof, stain-proof, and weather-resistance properties.

Also, the resultant laminate sheet could be bonded by fuse-bonding. This is a great advantage of the present invention, in comparison with the conventional sheet material wherein a metallic membrane was combined with a fabric substrate by sewing.

EXAMPLE 2

The same procedures as those described in Example 1 were carried out with the following exception.

The amorphous metal-containing core sheet was impregnated with the following composition.

| Component | Part by weight |
| --- | --- |
| Polyvinyl chloride resin paste | 100 |
| D.O.P. (Plasticizer) | 70 |
| Barium borate (Anti-smoking agent) | 20 |
| Aluminium hydroxide (Flame retardant) | 100 |
| Barium sulfate (Flame retardant) | 200 |
| Ba—Zn stabilizer | 2 |
| Pigment (Carbon Black) | 10 |

The impregnated sheet was squeezed at a squeeze ratio of 100%, dried at a temperature of 150° C. for 2 minutes, and heat-treated at a temperature of 185° C. for one minute. The resin composition-impregnated core sheet contained 70 g/m² of the resin composition.

An upper surface of the above-mentioned resin composition-impregnated core sheet was coated with a polyvinyl chloride resin film having the same composition as that mentioned above, except that the polyvinyl chloride resin paste was replaced by a polyvinyl chloride straight resin and the carbon black was used in an increased amount of 30 parts by weight. The coated polyvinyl chloride resin layer is in an amount of 200 g/m².

The resultant laminate sheet exhibited a satisfactory electromagnetic wave-shielding effect of 65 dB. The upper surface and lower surface of the laminate sheet exhibited specific volume resistivities of $3.2 \times 10^{-1}$ Ω—cm and $5.8 \times 10^{8}$ Ω—cm.

When the same KFC film as that described in Example 1 was adhered to the polyvinyl chloride resin coating layer, the resultant laminate sheet exhibited an excellent stain-proof property and weather-resistance.

EXAMPLE 3

The same procedures as those described in Example 1 were carried out with the following exception.

On the surface of the resin composition-impregnated core sheet was coated a polyvinyl chloride resin film having a thickness of 0.3 mm and the same composition as that described in Example 2, except that the resin composition contained 15 parts by weight of carbon black. Also, the opposite surface of the core sheet was coated with a polyvinyl chloride resin film having a thickness of 0.2 mm and the same composition as that mentioned above.

Further, the same KFC film as that described in Example 1 was adhered to the surface of the polyvinyl chloride resin film layer having a thickness of 0.3 mm.

The resultant laminate sheet exhibited a satisfactory electromagnetic wave-shielding effect, water-proof property, and stain-proof property and was useful as a packaging sheet wherein a high mechanical strength was not necessary.

EXAMPLE 4

The same procedures as those described in Example 1 were carried out, except that copper plating was not applied to the amorphous metal sheet.

The resultant laminate sheet exhibited an excellent electromagnetic wave shielding effect and water-proof property.

EXAMPLE 5

The same procedures as those described in Example 1 were carried out with the following exception.

The amorphous metal ribbons had a tensile strength in the range of from 65 to 125 kg/3 cm, an average tensile strength of 100 kg/3 cm, and an average ultimate elongation of 0.7%, determined in accordance with JIS L-1096 (1979), Section 6, 12, 1 (1), A method.

The 13 amorphous metal ribbons were arranged in parallel to each other in such a manner that longitudinal edge portions of each of the arranged ribbons were overlapped to a width of 1 mm. The ribbons were not soldered together.

The glass fiber victoria lawn was replaced by a glass fiber fabric (Trademark: KS-2671, produced by Kanebo Glass fiber Co. usable for FRP) having a thickness of 0.22 mm, a weight of 210 g/m$^2$, a plain weave structure of 19 warps/25.4 mm×19 wefts/25.4 mm a tensile strength of 111.6 kg/3 cm in each of warp and weft directions, and an ultimate elongation of 3.0% in each of warp and weft directions. The glass fibers in the fabric had a tensile strength of 350 kg/mm$^2$ and an ultimate elongation of 3%.

The polyester filament plain weave had a thickness of 0.3 mm, a weight of 40 g/m$^2$, a tensile strength of 25 kg/3 cm in each of warp and weft directions, and an ultimate elongation of 15% in each of warp and weft directions. The polyester filaments in the plain weave had a tensile strength of 110 kg/mm$^2$ and an ultimate elongation of 13%.

The amorphous metal sheet, in which the amorphous metal ribbons were not soldered together, was laminated with the glass fiber fabric and the polyester filament plain weave.

The finally resultant laminate sheet exhibited a satisfactory electromagnetic wave-shielding effect and excellent water-proof, stain-proof, and weather-resistance properties, and was capable of being fuse-bonded.

Also, the resultant laminate sheet had tensile strengths of 118.3 kg/3 cm in the warp direction and 115.8 kg/3 cm in the weft direction, which were much larger than the 65 kg/3 cm of the conventional sheet, and ultimate elongations of 3.3% in the warp direction and 3.6% in the weft direction. The dispersion in the tensile strength and the ultimate elongation of the resultant laminate sheet was very small. That is, although the amorphous metal ribbons were not soldered together, the resultant laminate sheet exhibited an excellent mechanical strength, had smooth and plain surfaces, and thus was usable for various industrial purposes.

EXAMPLE 6

The same procedures as those described in Example 5 were carried out with the following exception.

The 13 amorphous metal ribbons arranged in parallel to each other were soldered together at the overlapped edge portions to form an amorphous metal sheet.

The amorphous metal sheet had a width of about one meter and the soldered portions thereof exhibited a poor tensile strength in the range of from 40 to 86 kg/3 cm and an average tensile strength of 68.6 kg/3 cm.

In the preparation of the laminate sheet, the glass fiber fabric was replaced by a high modulus carbon fiber fabric having tensile strengths of 72.8 kg/3 cm in the warp direction and 70.5 kg/3 cm in the weft direction, and ultimate elongations of 0.6% in the warp direction and 0.5% in the weft direction. The carbon fibers had a tensile strength of 210 kg/mm$^2$ and an ultimate elongation of 0.6%.

The resin composition had the same composition as that described in Example 1, except that the amount of the carbon black powder was 30 parts by weight. The KFC film and the polyacrylic resin film were not laminated.

The finally resultant laminate sheet had tensile strengths of 78.5 kg/3 cm, in the warp direction and 75.4 kg/3 cm in the weft direction. The range of dispersion in the tensile strength of the laminate sheet was about 3 kg/3 cm or less in each of the warp and weft directions. That is, the resultant laminate had a very even mechanical strength and a satisfactory appearance, and exhibited a satisfactory electromagnetic wave-shielding effect.

When the same KFC film as that described in Example 1 was adhered to both surfaces of the laminate sheet, the resultant laminate sheet exhibited an excellent stain-proof property and weathering resistance.

EXAMPLE 7

The same amorphous metal sheet as that described in Example 5, wherein 13 amorphous metal ribbons were not soldered together, was coated on two surfaces thereof with two polyvinyl chloride resin films having the same composition as mentioned in Example 5, except that the carbon black powder was in an amount of 15 parts by weight, through an adhesive layer consisting of the same adhesive agent (SC 12N) as that mentioned in Example 1. One of the polyvinyl chloride resin films had a thickness of 0.3 mm and the other had a thickness of 0.2 mm.

The laminate sheet was produced without difficulty and without tearing, breakage, and/or cracking of the amorphous metal sheet, and could be used as a covering sheet, construction sheet, packaging sheet, or floor sheet for shielding electromagnetic waves.

EXAMPLE 8 AND COMPARATIVE EXAMPLE 1

In Example 8, one surface of the same copper-plated amorphous metal sheet as that described in Example 5 was coated with a first reinforcing fibrous fabric, which consisted of the same glass fiber fabric (KS-2671) as that described in Example 5, through an adhesive layer consisting of the same adhesive agent (SC 12N) as that described in Example 1.

A nylon 66 pile carpet was prepared from a substrate consisting of polyester fiber nonwoven fabric containing 5% by weight of carbon fibers and piles consisting of antistatic nylon 66 fiber yarns and having a length of 8 mm, and had a weight of 750 g/m².

The lower surface of the carpet was coated with a first electroconductive intermediate layer consisting of a polyvinyl chloride resin containing about 20% by weight of carbon black and having a thickness of about 1 mm.

The lower surface of the electroconductive intermediate layer was bonded to the upper surface of the reinforcing fibrous fabric layer bonded to one surface of the amorphous metal sheet layer.

The opposite surface of the amorphous metal sheet layer was coated with a second electroconductive layer, consisting of the same polyvinyl chloride resin as mentioned above, through the adhesive agent (SC 12N) layer, and then further coated with a second reinforcing fibrous fabric layer consisting of a glass fiber nonwoven fabric having a weight of 100 g/m² in such a manner that a portion of the polyvinyl chloride resin penetrated the glass fiber nonwoven fabric.

The resultant laminate carpet was cut into a number of tile carpets having a length and width of 50 cm.

In Comparative Example 1, the same procedures as those described in Example 8 were carried out except that the amorphous metal sheet was replaced by an aluminum foil having a thickness of 30 μm.

The carpets of Example 8 and Comparative Example 1 were subjected to electromagnetic wave-shielding tests in an electric field and in a magnetic field. The results are shown in FIGS. 8 and 9.

FIG. 8 shows that, in the electrical field, the amorphous metal laminate carpet of Example 8 exhibited a similar electromagnetic wave-shielding effect to that of the aluminum foil laminate carpet. Moreover, FIG. 9 shows that, in the magnetic field, the amorphous metal laminate carpet of Example 8 exhibited a significantly higher electromagnetic wave-shielding effect than that of Comparative Example 1.

EXAMPLE 9

The same procedures as those described in Example 8 were carried out except that the amorphous metal sheet had a number of round perforations having a diameter of 2 mm and a density of 3 perforations/cm².

In the resultant laminate carpet, the adhesive agent (SC 12N) layers formed on upper and lower surfaces of the amorphous metal sheet layer were bonded to each other through the perforations in the amorphous metal sheet layer. No bubbles were found between the amorphous metal sheet layer and the adhesive agent layers. Accordingly, the laminate carpet exhibited a satisfactory peeling strength.

EXAMPLE 10

One surface of the same amorphous metal sheet as described in Example 5, in which the parallel arranged 13 amorphous metal ribbons were overlapped at the longitudinal edge portions thereof at a width of 1 cm but not bonded together, was coated with a reinforcing fabric consisting of a glass fiber victoria lawn (Trademark: KS-5207, made by Kanebo Glass Fiber Co.) having a thickness of 0.1 mm, a weight of 38 g/m², a weave structure of 7 warps and 7 binding yarns/25.4 mm and 7 wefts/25.4 mm, tensile strengths of 18 kg/2.5 cm in the warp direction and 20 kg/2.5 cm in the weft direction, ultimate elongations of 3.0% in the warp and weft directions, a glass fiber tensile strength of 350 kg/mm², and a glass fiber ultimate elongation of 3%, through an adhesive agent (SC 12N) layer.

The upper surface of the reinforcing fabric layer was coated with a polyurethane foam layer having a thickness of 5 mm and a porosity of 97.5% (foaming ratio of 40) through an adhesive agent (SC 12N) layer.

The resultant laminate sheet exhibited an electromagnetic wave-shielding effect of 50 dB.

Since the glass fiber victoria lawn is highly stable dimensionally, the amorphous metal sheet was evenly bonded to the glass fiber victoria lawn without slippage of the amorphous metal ribbons. Also, the resultant laminate sheet had an satisfactory appearance and flat upper surface, and exhibited satisfactory tensile strength and tear strength.

EXAMPLE 11

The same amorphous metal sheet as that described in Example 10, except that the amorphous metal ribbons were soldered together, was coated with the same polyurethane foam layer as that described in Example 10 through an adhesive agent (SC 12N) layer.

The resultant laminate sheet exhibited an electromagnetic wave-shielding effect of 50 dB and satisfactory flexibility and mechanical strength, and was useful as a heavy packaging sheet.

EXAMPLE 12

The same amorphous metal sheet as that described in Example 1 wherein 13 amorphous metal ribbons were soldered at the longitudinal edge portions thereof having an overlapping width of 1 cm, was coated at two surfaces thereof with polyvinyl chloride resin films having a thickness of 0.05 mm through adhesive agent (SC 12N) layers.

The resultant amorphous metal-containing core sheet was adhered on a wall surface of an electromagnetic wave-shielding room.

A wallpaper sheet was then adhered onto the surface of the amorphous metal containing core sheet on the wall surface.

The resultant laminate wallpaper sheet on the wall surface exhibited a satisfactory electromagnetic wave-shielding effect.

EXAMPLE 13

The same procedures as those described in Example 12 were carried out except that one surface of the amorphous metal sheet was coated with a reinforcing fibrous fabric layer consisting of the same glass fiber fabric (KS-5210) as that described in Example 1, through an adhesive agent (SC 12N) layer, and the surface of the reinforcing fibrous fabric layer and the opposite surface of the amorphous metal sheet layer were coated with the same polyvinyl chloride resin films as that described in Example 12 through adhesive agent (SC 12N) layers.

The resultant laminate wallpaper sheet layer on the wall surface exhibited a satisfactory electromagnetic wave-shielding effect and a satisfactory appearance.

EXAMPLE 14

The same amorphous metal sheet as described in Example 1 was coated with a thin layer of the adhesive agent (SC 12N) and dried. A solution of a polyvinyl chloride resin was spread on the dried adhesive agent layer and was dried to form a polyvinyl chloride resin protecting layer having a thickness of 15 μm.

The resultant amorphous metal-containing core sheet having a length of 100 mm was wound around a core. No breakages or cracks were found in the core sheet.

The core sheet was unwound and laminated with the same glass fiber fabric and the same polyvinyl chloride resin film as those described in Example 13.

The resultant laminate sheet exhibited a satisfactory electromagnetic wave-shielding effect and mechanical strength.

EXAMPLE 15

Two surfaces of the same amorphous metal sheet as mentioned in Example 1 were coated with nylon 12 resin protecting layers in such a manner that the amorphous metal sheet was interposed between two transfer sheets in each of which a nylon 12 resin layer having a thickness of 2 μm was formed on a release paper, and the resultant combination was heat-pressed between a pair of pressing rolls so that the nylon 12 resin layers were transferred to the amorphous metal sheet surfaces.

The resultant amorphous metal-containing core sheet having a length of 200 m could be wound without breakage and cracking thereof.

The core sheet was unwound and coated with the same glass fiber fabrics and polyvinyl chloride resin films as those described in Example 13.

The resultant laminate sheet exhibited a satisfactory mechanical strength and flexibility and an excellent electromagnetic wave-shielding effect.

EXAMPLE 16

The same procedures as those described in Example 15 were carried out except that the amorphous metal sheet had a number of perforations in a density of about 25 perforations/100 cm². The nylon 12 resin protecting layers were bonded together through the perforations and no bubbles were found in the protecting layers.

EXAMPLE 17

A number of pieces of the same amorphous metal ribbons as those described in Example 1 having a length of 1 m were arranged in parallel to each other and soldered together at the longitudinal edge portions thereof to provide an amorphous metal sheet having a width of 1 m. The soldered portions of the sheet exhibited a tensile strength in the range of from 40 to 86 kg/3 cm and an average tensile strength of 68.6 kg/3 cm.

The same laminate sheet-forming procedures as those described in Example 5 were carried out by using the above-mentioned amorphous metal sheet. A laminate sheet having a length of 500 m could be produced without wrinkles forming in the sheet.

The resultant laminate sheet had a good and even appearance.

We claim:

EXAMPLE 18

The same laminate sheet-producing procedures as those described in Example 15 were carried out except that the same amorphous metal sheet as that described in Example 17 was used.

The resultant laminate sheet had a satisfactory appearance and electromagnetic wave-shielding effect.

EXAMPLE 19

The same procedures as those described in Example 18 were carried out except that the pieces of the amorphous metal ribbons which were not plated with copper were bonded together with an electroconductive bonding agent comprising an epoxy resin and silver and made by Fujikura Kasei under the trademark Dotite XA-119.

The resultant laminate sheet exhibited a satisfactory electromagnetic wave-shielding effect and appearance.

1. An amorphous metal laminate sheet comprising:
   (A) a core layer comprising at least one amorphous metal layer and at least one electroconductive metal plating layer formed on at least one surface of the amorphous metal layer, and
   (B) at least one flexible polymeric coating layer laminated on at least one surface of the core layer.

2. The laminate sheet as claimed in claim 1, wherein the electroconductive metal plating layer comprises at least one member selected from the group consisting of copper, nickel, cobalt, iron, aluminum, gold, silver, tin, zinc and alloys containing at least one member selected from the above mentioned metals.

3. The laminate sheet as claimed in claim 1, wherein the amorphous metal layer comprises a plurality of amorphous metal ribbons arranged in parallel to each other.

4. The laminate sheet as claimed in claim 3, wherein the amorphous metal ribbons extend in the longitudinal direction of the laminate sheet.

5. The laminate sheet as claimed in claim 3, wherein the amorphous metal ribbons extend in the transverse direction of the laminate sheet.

6. The laminate sheet as claimed in claim 3, wherein the amorphous metal ribbons are soldered together at the longitudinal edge portions thereof to provide a sheet body having a desired width.

7. The laminate sheet as claimed in claim 3, wherein the amorphous metal ribbons are bonded together at the longitudinal edge portions thereof with a bonding agent, to provide a sheet body having a desired width.

8. The laminate sheet as claimed in claim 1, wherein the flexible polymeric coating layer has a water-proof property.

9. The laminate sheet as claimed in claim 1, wherein the flexible polymeric coating layer comprises a flexible, water-proof polymeric base layer laminated on the amorphous metal-containing core layer and a stain-proof, weather-resistance polymeric surface layer formed on the flexible, water-proof polymeric base layer.

10. The laminate sheet as claimed in claim 9, wherein the stain-proof, weather-resistant polymeric surface layer comprises at least one member selected from the group consisting of fluorine-containing polymers and polyacrylic polymers.

11. The laminate sheet as claimed in claim 1, wherein the amorphous metal-containing core layer has thickness of 1000 μm or less.

12. The laminate sheet as claimed in claim 1, wherein the electroconductive metal plating layer has a thickness of 0.1 μm or more.

13. The laminate sheet as claimed in claim 1, wherein the flexible polymeric coating layer has a thickness of 50 μm or more.

14. The laminate sheet as claimed in claim 1, wherein the amorphous metal layer comprises a principal component consisting of at least one member selected from the group consisting of Fe, Co, Ni, Pd, Cu, Nb and Ti and an additional component consisting of at least one member selected from the group consisting of B, Si, C, Co, Ni, Cr, Zr, Nb, Cu, Ti and Mo, but not containing the metal contained in the principal component.

15. The laminate sheet as claimed in claim 1, which further comprises at least one reinforcing fibrous fabric layer laminated on at least one surface of the amorphous metal-containing core layer to provide a substrate layer and the at least one flexible polymeric coating layer is arranged on at least one surface of the substrate layer.

16. The laminate sheet as claimed in claim 15, wherein the reinforcing fibrous fabric layer comprises at least one type of fibers selected from the group consisting of glass fibers, carbon fibers, metal fibers, polyester fibers, aliphatic polyamide fibers, aromatic polyamide fibers, polyvinyl chloride fibers, polyacrylic fibers, and polyolefin fibers.

17. The laminate sheet as claimed in claim 15, wherein the reinforcing fibrous fabric layer has a greater tensile strength than that of the amorphous metal-containing core layer.

18. The laminate sheet as claimed in claim 15, wherein the reinforcing fibrous fabric layer has an ultimate elongation of 5% or less.

19. The laminate sheet as claimed in claim 15, wherein the fibrous fabric layer comprises fibers having a tensile strength of 130 kg/mm$^2$ or more and an ultimate elongation of 5% or less.

20. The laminate sheet as claimed in claim 15, wherein the amorphous metal-containing core layer is laminated on one surface thereof with a reinforcing fibrous fabric layer comprising high tensile strength fibers having a tensile strength of 130 kg/mm$^2$ or more and an ultimate elongation of 5% or less and on the other surface thereof with another reinforcing fibrous fabric layer comprising high elongation fibers having a tensile strength of less than 130 kg/mm$^2$ and an ultimate elongation of more than 5%.

21. The laminate sheet as claimed in claim 15, wherein the reinforcing fibrous fabric layer comprises a high tensile strength fibers having a tensile strength of 130 kg/mm$^2$ or more and an ultimate elongation of 5% or less and high elongation fibers having a tensile strength of less than 130 kg/mm$^2$ and an ultimate elongation of more than 5%.

22. The laminate sheet as claimed in claim 15, wherein the reinforcing fibrous fabric layer comprises at least one fibrous layer comprising a high tensile strength fibers having a tensile strength of 130 kg/mm$^2$ or more and an ultinate elongation of 5% or less and at least one fibrous layer comprising a high elongation fibers having a tensile strength of less than 130 kg/mm$^2$ and an ultimate elongation of more than 5%.

23. The laminate sheet as claimed in claim 1, wherein the flexible polymeric coating layer comprises at least one fibrous fabric covering layer.

24. The laminate sheet as claimed in calim 23, wherein the fibrous fabric covering layer is in the form of a fabric sheet.

25. The laminate sheet as claimed in claim 23, wherein the fibrous fabric covering layer is in the form of a carpet.

26. The laminate sheet as claimed in claim 23, wherein the fibrous fabric covering layer comprises a fabric underlayer and a pile upperlayer formed from a number of fibrous yarns projecting from the fabric underlayer.

27. The laminate sheet as claimed in claim 26, wherein the fabric underlayer of the fibrous fabric covering layer is bonded to a surface of the amorphous metal-containing core layer through a flexible polymeric bonding layer, and the other surface of the amorphous metal-containing core layer is covered with another flexible polymeric coating layer.

28. The laminate sheet as claimed in claim 1, wherein the flexible polymeric coating layer is porous.

29. The laminate sheet as claimed in claim 28, which further comprises a reinforcing fibrous fabric layer laminated on the porous flexible polymeric coating layer.

30. The laminate sheet as claimed in claim 1, wherein a surface of the amorphous metal-containing core layer is coated with a porous flexible polymeric coating layer and the opposite surface of the core layer is coated with a flexible non-porous polymeric coating layer.

31. The laminate sheet as claimed in claim 30, which further comprises a reinforcing fibrous fabric layer laminated on the flexible non-porous polymeric coating layer.

32. The laminate sheet as claimed in claim 1, wherein the flexible polymeric coating layer comprises at least one paper sheet layer adhered to the amorphous metal-containing core layer.

33. The laminate sheet as claimed in claim 32, wherein the paper sheet layer is adhered to the amorphous metal-containing core layer through a flexible polymeric bonding layer.

34. The laminate sheet as claimed in claim 32, wherein one surface of the amorphous metal-containing core layer is bonded to a flexible polymeric coating layer comprising a paper sheet and the opposite surface of the core layer is bonded to another flexible polymeric coating layer free from the paper sheet layer.

35. The laminate sheet as claimed in claim 32, wherein the paper sheet layer is in the form of a wallpaper sheet.

36. The laminate sheet as claimed in claim 32, wherein the paper sheet is a paper sheet, a paper-like synthetic polymer sheet, a paper-like fibrous fabric sheet or a combination of at least two of the above-mentioned sheets.

* * * * *